United States Patent [19]

Sugibayashi et al.

[11] Patent Number: 4,594,611
[45] Date of Patent: Jun. 10, 1986

[54] STATION SELECTING METHOD FOR TELEVISION RECEIVER

[75] Inventors: Kiyoshi Sugibayashi; Tomihiro Oguchi; Hiroyuki Takahori, all of Tokyo, Japan

[73] Assignee: Pioneer Electronic Corporation, Tokyo, Japan

[21] Appl. No.: 594,661

[22] Filed: Mar. 29, 1984

[30] Foreign Application Priority Data

Mar. 29, 1983 [JP] Japan .................................. 58-51503

[51] Int. Cl.$^4$ ........................ H04N 5/50; H04B 11/32; H04B 11/16
[52] U.S. Cl. ............................... 358/191.1; 358/193.1; 455/164; 455/192
[58] Field of Search ........................ 358/191.1, 193.1; 455/164, 161, 192

[56] References Cited

U.S. PATENT DOCUMENTS 4,429,415  1/1984  Chin et al. .................. 358/193.1 X

FOREIGN PATENT DOCUMENTS 2089607  6/1982  United Kingdom ................ 455/164

Primary Examiner—James J. Groody
Assistant Examiner—E. Anne Toth
Attorney, Agent, or Firm—Sughrue, Mion, Zinn, Macpeak & Seas

[57] ABSTRACT

A method for tuning a television receiver in which an optimum local oscillator frequency is selected for offset stations. A local oscillator frequency of the receiver is incremented in steps of a first predetermined frequency interval beginning with a frequency at the bottom of an offset band around the center frequency of the local oscillator. As the local oscillator frequency is scanned, when both an up signal, indicative that the tuning frequency is above a predetermined range around the actual frequency of the received signal, and a down signal, indicative that the tuning frequency is below the predetermined range around the center frequency, the local oscillator is decremented by the first frequency interval and then incremented in a second, smaller frequency interval until the up and down signals are both lost. The local oscillator frequency is then increased and decreased by the first predetermined frequency interval, wherein, if both the up and down signals toggle states, the frequency at which both the up and down signals were lost when scanning with the second frequency interval is accepted as the best tuning frequency.

8 Claims, 9 Drawing Figures

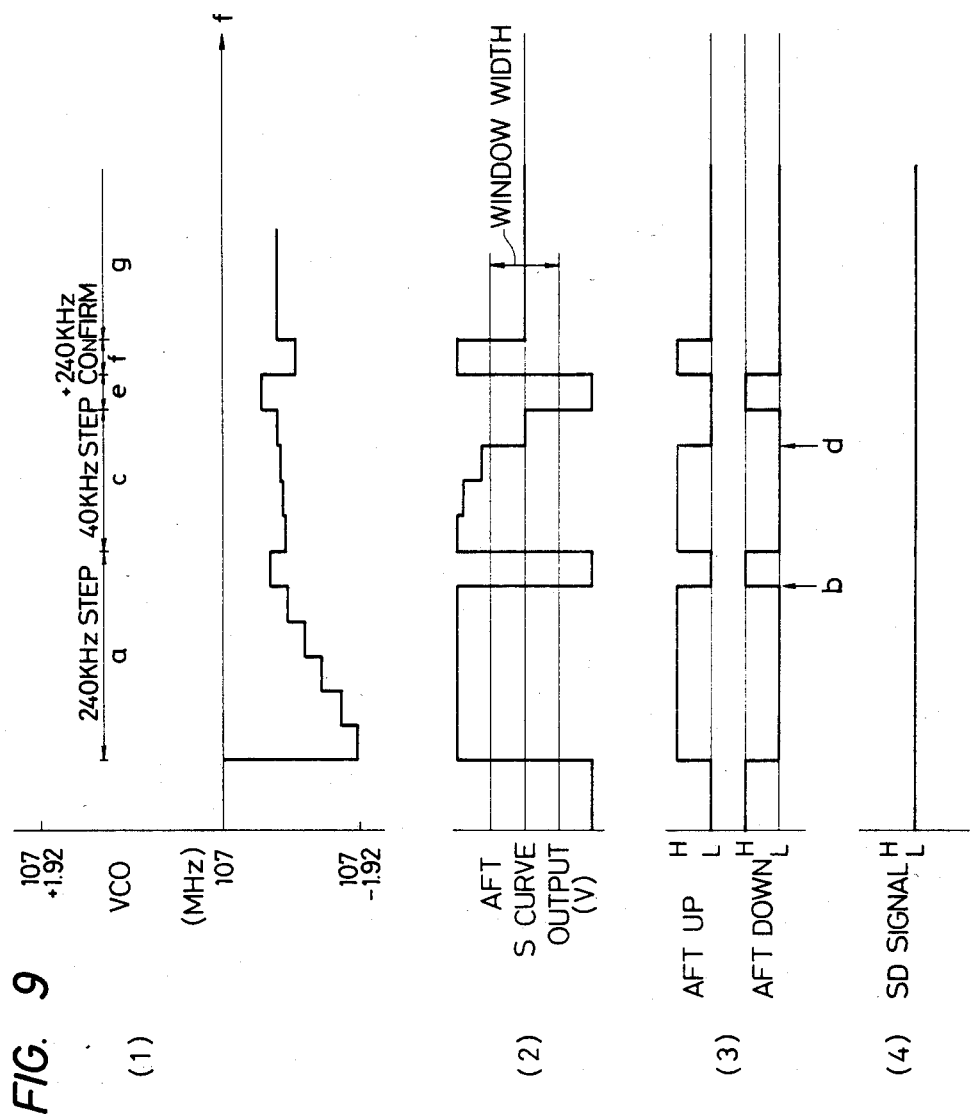

STATION SELECTING METHOD FOR TELEVISION RECEIVER

BACKGROUND OF THE INVENTION

The present invention relates to a station selecting method for a television receiver. More particularly, the invention relates to a station selecting method for determining the best frequency for signal reception by using an AFT up signal, an AFT down signal, and a station detection signal.

A station selecting device of the type to which the invention pertains is shown in FIG. 1, which illustrates a television receiver. A signal received through the antenna 1 is amplified by the RF amplifier. The signal thus amplified is converted into an intermediate frequency signal in a frequency mixer 3 by mixing with a local oscillator signal provided by the VCO 4. After being amplified by the IF amplifier 5, the intermediate frequency signal is applied to a video detector 6 with which a video signal is obtained. The video signal thus obtained is applied to the synchronizing signal separator circuit 7 with which a horizontal synchronizing signal and a vertical synchronizing signal are separated from the video signal.

The video carrier is extracted by the video detector 6. The video carrier is applied through a limiter to the AFT detector 8 used to obtain an AFT S-curve output. The S-curve output is applied to the AFT signal generator 9. When the S-curve output signal is lower by at least a predetermined frequency than the center frequency of the video signal, an AFT up signal is produced, and when it is higher by at least the predetermined frequency, an AFT down signal is produced. The output of the synchronizing separator circuit 7 is applied to the station detection signal generator 10 which in response thereto produces a station detection signal (hereinafter referred to as a SD signal) when the output signal of a station is received. These up and down signals and the SD signal are applied to the control circuit 11 which utilizes the SD signal to determine the presence or absence of stations, the AFT up signal to increase the frequency of the local oscillator signal from the VCO 4, and the AFT down signal is used to decrease that frequency.

The forms of the SD signal, the AFT up signal and the AFT down signal are as shown in FIG. 2, in which the predetermined frequency is 2 MHz. In FIG. 2, a period a in which the SD signal is at H (high logic level) and both of the AFT up signal and AFT down signal are at L (low logic level) corresponds to the best receiving frequency range. However, since the same condition is present in the periods b and c in the vicinity of ±2 MHz, (where is the center frequency of the video signal), the period b or c can be mistaken for the best receiving frequency range. Especially when there is an offset in the transmitting frequency, it is difficult to correctly detect the correct receiving frequency range period a. This will be described in more detail.

For instance, in receiving television channel 3 (United States specifications) the video frequency (P) is 61.25 MHz and the sound frequency (S) is 65.75 MHz as indicated in FIG. 3. If the local oscillator frequency OSC is 107 MHz, the video frequency (P) and the sound frequency (S) are converted to respective IF frequencies of 45.75 MHz and 41.25 MHz. A SAW filter having a passband characteristic as shown in FIG. 4 passes the channel 3 signal only and suppresses the other unwanted channel signals. The center frequency of the video signal of 45.75 MHz is subjected to FM detection by the AFT detector. If the local oscillator frequency is increased and decreased around 107 MHz, then the S curve signal changes as shown in FIG. 5. It should be noted that FIG. 5 shows the characteristic curve provided when there is no offset in the transmitted channel 3 signal. If adjustment is so made that when the local oscillator frequency is 107 MHz the S curve is at the center (the video carrier is 45.75 MHz) and a window is provided around the center as shown in FIG. 5, then the up signal is produced by the AFT signal generator 9 (a comparator) when the output voltage is above the window (on the left-hand side of the S curve in the drawing) and the down signal is produced when the output voltage is below the window (on the right-hand side of the S-curve). It is accordingly determined whether the local oscillator frequency should be increased or decreased. However, because of the bandpass characteristics of the SAW filter, the upper and lower parts of the S-curve are not symmetrical, and the upper frequency band (the right-hand side of the S-curve) is narrow. Accordingly, in the conventional AFT device utilizing an S-curve detection technique, the width absorbed by the AFT is vertically asymmetrical with respect to the center frequency of the video signal, and it is limited (to about 1 MHz) in upper frequency.

SUMMARY OF THE INVENTION

Accordingly, it is an object of the invention to eliminate the above-described difficulties accompanying a conventional station selecting method.

Specifically, the invention provides a station selecting method in which the desired channel is scanned beginning with a frequency which is lower by a predetermined value than the center frequency of the video signal to detect an AFT down signal, thereby to determine the best local oscillator frequency so that the best receiving frequency is determined at all times, even when there is an offset in the transmitting frequency.

BRIEF DESCRIPTION OF THE DRAWINGS

FIG. 9 is a diagram indicating (1) a local oscillator frequency provided when a station is selected according to the station selecting method of the invention, (2)

an AFT S curve, (3) an AFT up signal and an AFT down signal, and (4) an SD signal.

DESCRIPTION OF THE PREFERRED EMBODIMENTS

Figure 1:
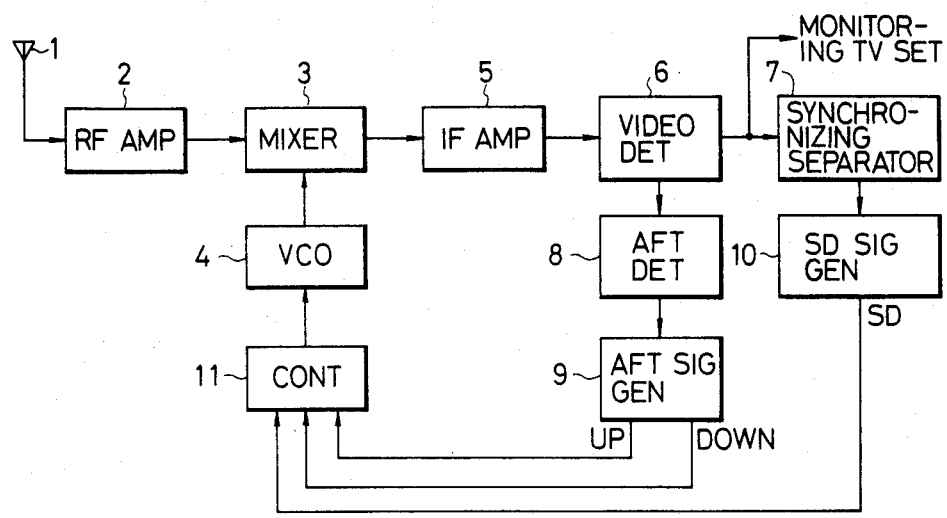
FIG. 1 is a block diagram showing the arrangement of a station selecting device used for a description of a conventional station selecting method and of a station selecting method according to the invention.
Figure 2:
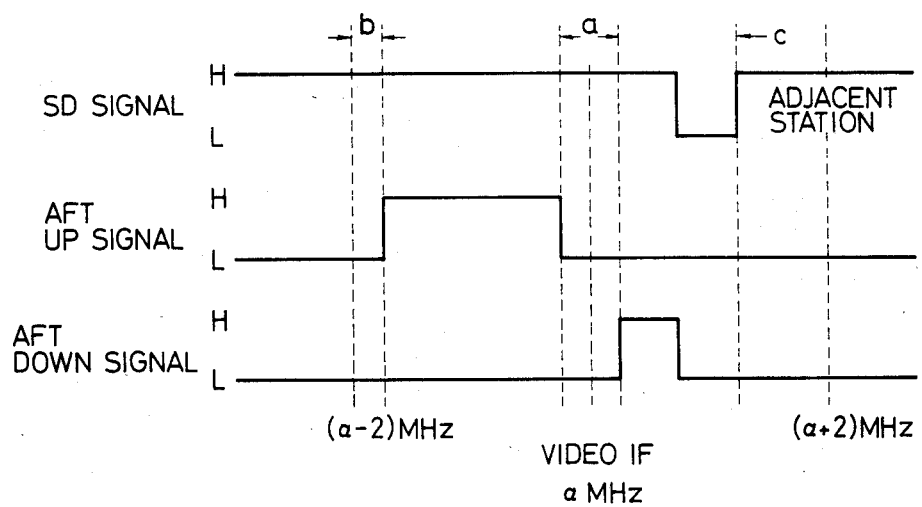
FIG. 2 is a timing chart showing a station detection signal, an AFT up signal, and an AFT down signal for a description of the conventional station selecting method.
Figure 3:
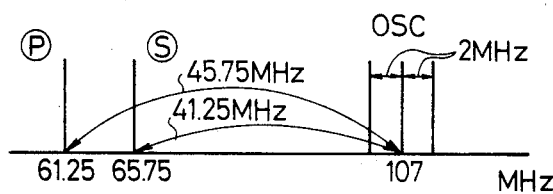
FIG. 3 is a diagram showing an example of the video and sound frequencies of a broadcasting station.
Figure 4:
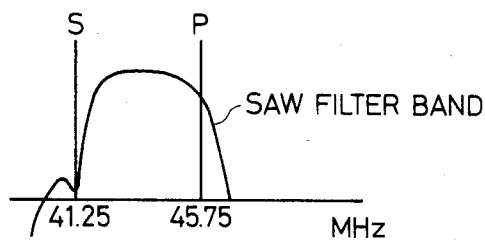
FIG. 4 is a diagram showing the frequencies in FIG. 3 subjected to frequency conversion.
Figure 5:
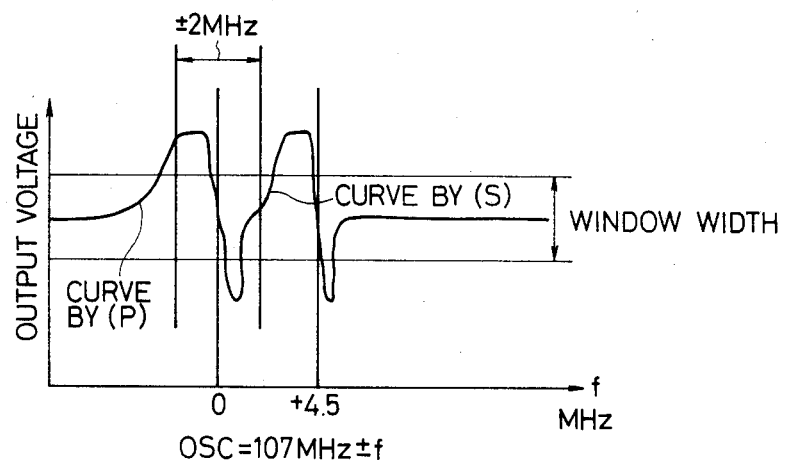
FIG. 5 is a diagram showing the detection outputs of the video and sound signals in FIGS. 3 and 4.

A station selecting method according to the invention will now be described. The arrangement of a station selecting device for practicing the method of the invention can be as shown in FIG. 1. The AFT up signal and the AFT down signal outputted by the AFT signal generator 9 and the SD signal outputted by the station detection signal generator 10 are compared in the control circuit to determine the local oscillator frequency.

Figure 6:
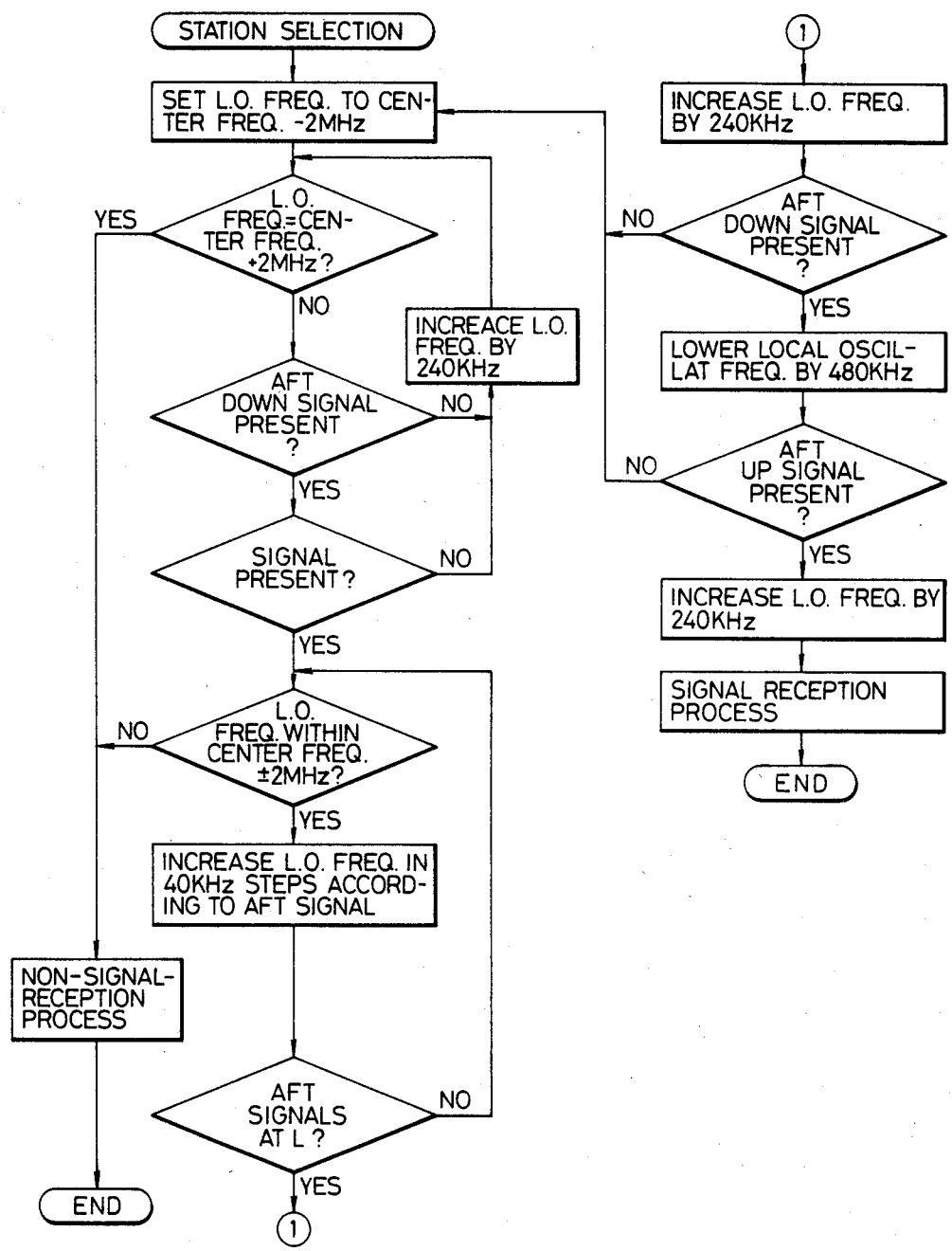
FIG. 6 is a flow chart showing an example of an algorithm of the station selecting method according to the invention.

The operation of the control circuit 11 is shown in the flow chart of FIG. 6. First, the maximum frequency width of an offset station is set, and the local oscillator frequency is set to a value which is lower by the offset frequency than its center frequency. In this case, offset stations within a width of ±2 MHz can be received.

Next, while the local oscillator frequency is increased at invervals of 240 KHz (chosen in order to provide a fast signal searching speed), scanning is performed until the AFT down signal is detected and the SD signal is present. In the case where the AFT down signal and the SD signal are present in the offset frequency range, scanning is conducted at frequency intervals less than 240 KHz so that the signal can be received better. For instance, if the frequency interval is set to 40 KHz and the local oscillator frequency is x KHz when the AFT down signal is obtained, the local oscillator frequency is increased at frequency intervals of 40 KHz beginning with the preceding frequency (x−240) KHz until the AFT up signal and the AFT down signal are lost. When a frequency at which none of the signals is present is detected in the offset frequency range, the local oscillator frequency is increased and decreased by the scanning step frequency 240 KHz used for detection of the AFT down signal and the SD signal to confirm the fact that the AFT down signal is detected when the local oscillator frequency is increased and the AFT up signal is detected when it is decreased. When all these conditions have been satisfied, the frequency at which the AFT down signal and the AFT up signal are detected in the above-described procedure is determined as the best signal receiving local oscillator frequency.

Figure 7:
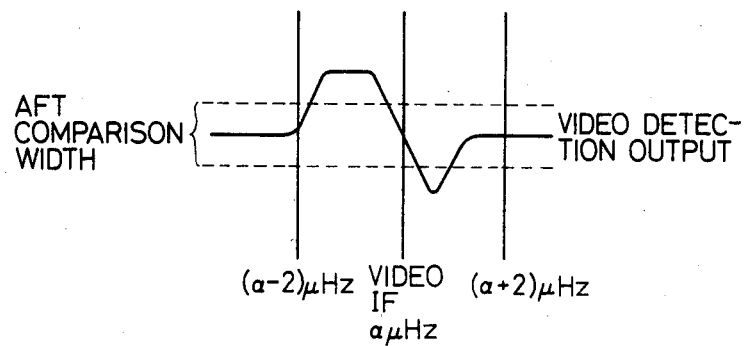
FIG. 7 is a diagram showing a video detection output for obtaining an AFT up signal and an AFT down signal in the invention.

The SD signal is obtained by extracting and smoothing the horizontal synchronizing signal. The AFT up signal and the AFT down signal are obtained by applying the video detection output to a comparator having a predetermined window width, as shown in FIG. 7, so that neither of the up and down signals is present in a range of ±40 KHz around the center frequency, with 40 KHz being the step frequency used after the detection of the AFT down signal and the SD signal.

Figure 8:
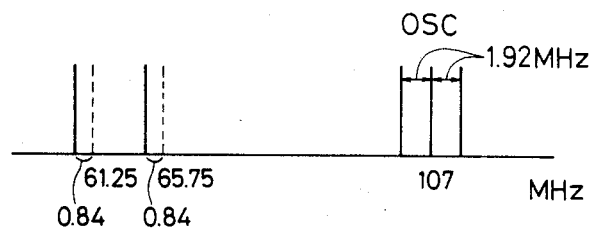
FIG. 8 is a diagram showing video and sound frequencies in FIG. 3 which have been offset.

The station selecting method of the invention will be further described with reference to FIG. 8 illustrating the case of channel 3 (U.S.) offset by −0.84 MHz. In this discussion, it is assumed that the receivable frequency range of an offset station is ±1.92 MHz. Furthermore, it is assumed that the case where the SD signal is present is represented by $L_1$, and the case where both the AFT up signal and the AFT down signal are within the window shown in FIG. 7 is represented by L. The station's most suitable receiving frequency is obtained when the SD signal, the AFT up signal and the AFT down signals are all at L, and it is determined that the station is at the center frequency when (within ±240 KHz) when the levels of the up and down signals change from L to H and from H to L, respectively.

Initially, the station is not at the center frequency. Therefore, in order to search for the station, the local oscillator frequency is reduced to (107 MHz−1.92 MHz), and then the local oscillator frequency is increased at intervals of 240 KHz as indicated in diagram (1) of FIG. 9. In the search period a, the local oscillator frequency is lower than the center frequency, and therefore the video detection output is above the window, as shown in diagram (2) of FIG. 9. Accordingly, the AFT up signal is at H while the AFT down signal is at L, as indicated in diagram (3) of FIG. 9. When the AFT down signal is firstly raised to H by stepwise increasing the local oscillator frequency (point b), it is determined whether or not the SD signal in diagram (4) of FIG. 9 is at L. If the SD signal is at L, 240 KHz is subtracted from the present local oscillator frequency, and the resultant local oscillator frequency is increased in 40 KHz steps to search for the point where both the AFT up signal and the AFT down are at L (period c). When the frequency at which the two signals are at L and the SD signal is also at L is detected, that frequency is shifted by ±240 KHz (periods e and f) to confirm that the levels of the AFT up signal and the AFT down signal change from L to H and from H to L, respectively, whereupon it is determined that the frequency at the point d where the AFT up signal, the AFT down signal and the SD signal are at L is the best local oscillator frequency for signal reception (period g). Thus, the signal of the station is received with the best local oscillator frequency thus determined.

In the above-described embodiment, the control circuit 11 is preferably implemented with a microcomputer; however, it may be constructed using discrete logic circuits. Furthermore, although in the described embodiment, the SD signal is obtained from the horizontal synchronizing signal, it may be formed using the vertical synchronizing signal. In addition, when a station is detected, other means may be employed to produce the SD signal near the signal of the station. The frequency range for an offset station may of course be other than ±2 MHz or ±1.92 MHz. Moreover, although in the above-described embodiment the local oscillator frequency is increased in 240 KHz steps and in 40 KHz steps for scanning a channel, the invention is not limited thereto or thereby. That is, the scanning step frequencies may be other than 240 KHz and 40 KHz, and more than two frequencies may be used. Also, the directions of scanning can be reversed.

It is apparent from the above description, according to the invention, the best local oscillator frequency can be selected for an offset station with the aid of the SD signal, the AFT up signal and the AFT down signal.

We claim:

1. A method for tuning a receiver having means for producing a down signal when a tuning frequency is below a predetermined frequency band around the actual frequency of a received signal and an up signal when said tuning frequency is above said predetermined frequency band around said actual frequency, comprising the steps of:

incrementing a local oscillator frequency of said receiver in steps of a first predetermined frequency interval beginning with a frequency lower by a predetermined frequency than a center frequency of said local oscillator;

after the occurrence of both said up signal and said down signal, decrementing said local oscillator frequency by a second predetermined frequency interval and then incrementing said local oscillator frequency in steps of a third predetermined frequency interval smaller than said first frequency interval until a frequency is reached at which both said up signal and said down signal are lost;

alternately increasing and decreasing said local oscillator frequency by a fourth predetermined frequency interval; and if said up signal and said down signal are respectively present and not present upon increasing said local oscillator frequency by said fourth predetermined frequency interval and respectively not present and present upon decreasing said local oscillator frequency by said fourth predetermined frequency interval, employing said frequency at which both said up and down signals are lost as a receiving frequency.

2. The tuning method of claim 1, wherein said first, second and fourth predetermined frequency intervals are equal to one another.

3. The tuning method of claim 1, wherein said receiver further comprises means for producing a detection signal indicative of the presence of a received signal, and wherein said frequency at which both said up and down signals are lost is employed as said receiving signal only when said signal indicative of the presence of a received signal is absent.

4. The tuning method of claim 3, wherein said receiver is a television receiver, and said detection signal producing means produces said detection signal in response to the presence of horizontal synchronizing pulses in said received signal.

5. A method for tuning a receiver having means for producing a down signal when a tuning frequency is below a predetermined frequency band around the actual frequency of a received signal and an up signal when said tuning frequency is above said predetermined frequency band around said actual frequency, comprising the steps of:

decrementing a local oscillator frequency of said receiver in steps of a first predetermined frequency interval beginning with a frequency higher by a predetermined frequency than a center frequency of said local oscillator;

after the occurrence of both said up signal and said down signal, incrementing said local oscillator frequency by a second predetermined frequency interval and then decrementing said local oscillator frequency in steps of a third predetermined frequency interval smaller than said first frequency interval until a frequency is reached at which both said up signal and said down signal are lost;

alternately increasing and decreasing said local oscillator frequency by a fourth predetermined frequency interval;

if said up signal and said down signal are respectively present and not present upon increasing said local oscillator frequency by said fourth predetermined frequency interval and respectively not present and present upon decreasing said local oscillator frequency by said fourth predetermined frequency interval, employing said frequency at which both said up and down signals are lost as a receiving frequency.

6. The tuning method of claim 5, wherein said first, second and fourth predetermined frequency intervals are equal to one another.

7. The tuning method of claim 5, wherein said receiver further comprises means for producing a detection signal indicative of the presence of a received signal, and wherein said frequency at which both said up and down signals are lost is employed as said receiving signal only when said signal indicative of the presence of a received signal is absent.

8. The tuning method of claim 7, wherein said receiver is a television receiver, and said detection signal producing means produces said detection signal in response to the presence of horizontal synchronizing pulses in said received signal.

* * * * *